US012640342B2

(12) United States Patent
Ueno et al.

(10) Patent No.: US 12,640,342 B2
(45) Date of Patent: May 26, 2026

(54) HIGH-FREQUENCY POWER SUPPLY DEVICE

(71) Applicant: DAIHEN Corporation, Osaka (JP)

(72) Inventors: Yuya Ueno, Osaka (JP); Yuichi Hasegawa, Osaka (JP)

(73) Assignee: DAIHEN Corporation, Osaka (JP)

( * ) Notice: Subject to any disclaimer, the term of this patent is extended or adjusted under 35 U.S.C. 154(b) by 77 days.

(21) Appl. No.: 18/396,319

(22) Filed: Dec. 26, 2023

(65) Prior Publication Data

US 2024/0222074 A1 Jul. 4, 2024

(30) Foreign Application Priority Data

Dec. 28, 2022 (JP) ................................. 2022-211685

(51) Int. Cl.
*H01J 37/32* (2006.01)
*H03H 7/01* (2006.01)

(52) U.S. Cl.
CPC ..... *H01J 37/32009* (2013.01); *H03H 7/0115* (2013.01); *H01J 2237/327* (2013.01); *H01J 2237/334* (2013.01)

(58) Field of Classification Search
CPC .............. H03H 7/0115; H01J 37/32009; H01J 37/32091; H01J 37/32174
See application file for complete search history.

(56) References Cited

U.S. PATENT DOCUMENTS

2004/0061219 A1* 4/2004 Utsumi ................... H01L 23/66
257/718
2007/0076344 A1 4/2007 Hamaishi et al.

2013/0321358 A1* 12/2013 Park .................... G06F 3/03545
345/179
2020/0203119 A1 6/2020 Van Zyl
2020/0227270 A1* 7/2020 Iwase ................ H01L 21/31116
2020/0350140 A1 11/2020 Van Zyl
2021/0175050 A1 6/2021 Van Zyl
2022/0208519 A1 6/2022 Hasegawa et al.
2023/0086313 A1 3/2023 Van Zyl

FOREIGN PATENT DOCUMENTS

JP 2007-103102 A 4/2007
JP 2022-514377 A 2/2022
JP 2022-102688 A 7/2022

* cited by examiner

*Primary Examiner* — Patrick C Chen

(74) *Attorney, Agent, or Firm* — Rimon P.C.

(57) ABSTRACT

A high-frequency power supply device includes a first power supply that outputs a high-frequency AC voltage having a first frequency, a second power supply that outputs a DC pulse voltage including one or more continuous pulse waveforms, a matching box that receives the high-frequency AC voltage, performs impedance matching such that impedance viewed from the first power supply becomes constant, and outputs the high-frequency AC voltage, a filter that receives the DC pulse voltage, filters the DC pulse voltage, and outputs the DC pulse voltage to a pulse-power input terminal of a load, and an IMD suppression circuit that includes a first inductor having predetermined inductance provided between the matching box and an AC-power input terminal of the load, receives the high-frequency AC voltage, allows the input high-frequency AC voltage to pass through the first inductor, and outputs the high-frequency AC voltage to the AC-power input terminal of the load.

5 Claims, 7 Drawing Sheets

(A) FIRST PULSE SIGNAL (B) HIGH-FREQUENCY
AC VOLTAGE (C) SECOND PULSE SIGNAL (D) DC PULSE VOLTAGE

TIME

HIGH-FREQUENCY POWER SUPPLY DEVICE

CROSS-REFERENCE TO RELATED APPLICATIONS

This application is based upon and claims the benefit of priority from Japanese Patent Application No. 2022-211685, filed on Dec. 28, 2022, the entire contents of which are incorporated herein by reference.

FIELD

Embodiments described herein relate generally to a high-frequency power supply device.

BACKGROUND

There has been known a high-frequency power supply device that simultaneously inputs, to a plasma generator, a high-frequency AC voltage for maintaining plasma and a DC pulse voltage including a continuous pulse waveform for operating the plasma. Such a high-frequency power supply device is used, for example, when a sample such as a semiconductor wafer is anisotropically etched in the plasma generator.

When the high-frequency AC voltage and the DC pulse voltage are simultaneously input to the plasma generator, intermodulation distortion (hereinafter, also referred to as IMD) occurs in the high-frequency AC voltage. Because of the occurrence of the IMD, reflected power returning to an HF power supply that generates the high-frequency AC voltage varies according to pulse waveforms included in the DC pulse voltage. The high-frequency power supply device includes a matching box between the HF power supply and the plasma generator. However, in the matching box, the change speed of impedance is lower than the change speed of the reflected power by the IMD, and thus it is difficult to reduce the reflected power by the IMD.

For example, "JP 2007-103102 A and JP 2022-102688 A" describe a high-frequency power supply device that superimposes a high-frequency AC voltage and a low-frequency AC voltage and inputs the superimposed voltages to a plasma generator. The high-frequency power supply device described in "JP 2007-103102 A and JP 2022-102688 A" perform frequency modulation on the high-frequency AC voltage according to a waveform of the low-frequency AC voltage. Consequently, the high-frequency power supply devices described in "JP 2007-103102 A and JP 2022-102688 A" can reduce reflected power by offsetting IMD that occurs in the high-frequency AC voltage because of the influence of the low-frequency AC voltage. However, the DC pulse voltage including the continuous pulse waveform for operating the plasma is higher than the low-frequency AC voltage described in "JP 2007-103102 A and JP 2022-102688 A". For this reason, when the high-frequency AC voltage is frequency-modulated according to the pulse waveform included in the DC pulse voltage, the high-frequency power supply device has to include a broadband HF power supply because a frequency modulation degree becomes very large. Therefore, in the high-frequency power supply device, when the high-frequency AC voltage is frequency-modulated according to the pulse waveform included in the DC pulse voltage, the device is increased in size and power cannot be efficiently supplied.

"JP 2022-514377 A" describes a high-frequency power supply device including a narrow band-pass filter provided between a HF power supply and a matching box. In the high-frequency power supply device described in "JP 2022-514377 A", the band-pass filter prevents a reflected wave from being attenuated or allowed to pass. Consequently, the high-frequency power supply device described in "JP 2022-514377 A" can contain the reflected wave between the band-pass filter and the matching box to suppress the IMD.

However, the matching box measures an electric current and a voltage at an input end of the matching box to calculate impedance. Alternatively, the matching box measures a travelling wave and a reflected wave at the input end of the matching box to calculate impedance. The matching box performs a matching operation based on the calculated impedance. However, in the high-frequency power supply device described in "JP 2022-514377 A", because the band pass filter is inserted between the HF power supply and the matching box, the reflected wave output from the matching box and the reflected wave returning to the HF power supply are different. Therefore, the high-frequency power supply device described in "JP 2022-514377 A" cannot perform the matching operation to reduce the reflected wave returning to the HF power supply and cannot perform an accurate matching operation.

SUMMARY

To solve the problem described above and achieve an object of the present disclosure, a high-frequency power supply device includes: a first power supply configured to output a high-frequency AC voltage that is an AC voltage having a first frequency; a second power supply configured to output a DC pulse voltage including one or a plurality of continuous pulse waveforms; a matching box configured to receive input of the high-frequency AC voltage from the first power supply, perform impedance matching such that impedance viewed from the first power supply becomes constant, and output the high-frequency AC voltage; a filter configured to receive input of the DC pulse voltage from the second power supply, filter the DC pulse voltage, and output the filtered DC pulse voltage to a pulse-power input terminal of a load; and an IMD (intermodulation distortion) suppression circuit including a first inductor having predetermined inductance provided between the matching box and an AC-power input terminal of the load, the IMD suppression circuit being configured to receive input of the high-frequency AC voltage output from the matching box, allow the input high-frequency AC voltage to pass through the first inductor, and output the high-frequency AC voltage to the AC-power input terminal of the load.

BRIEF DESCRIPTION OF THE DRAWINGS

FIG. 2 is a diagram illustrating waveforms of a high-frequency AC voltage, a DC pulse voltage, and the like;

DETAILED DESCRIPTION

Figure 1:
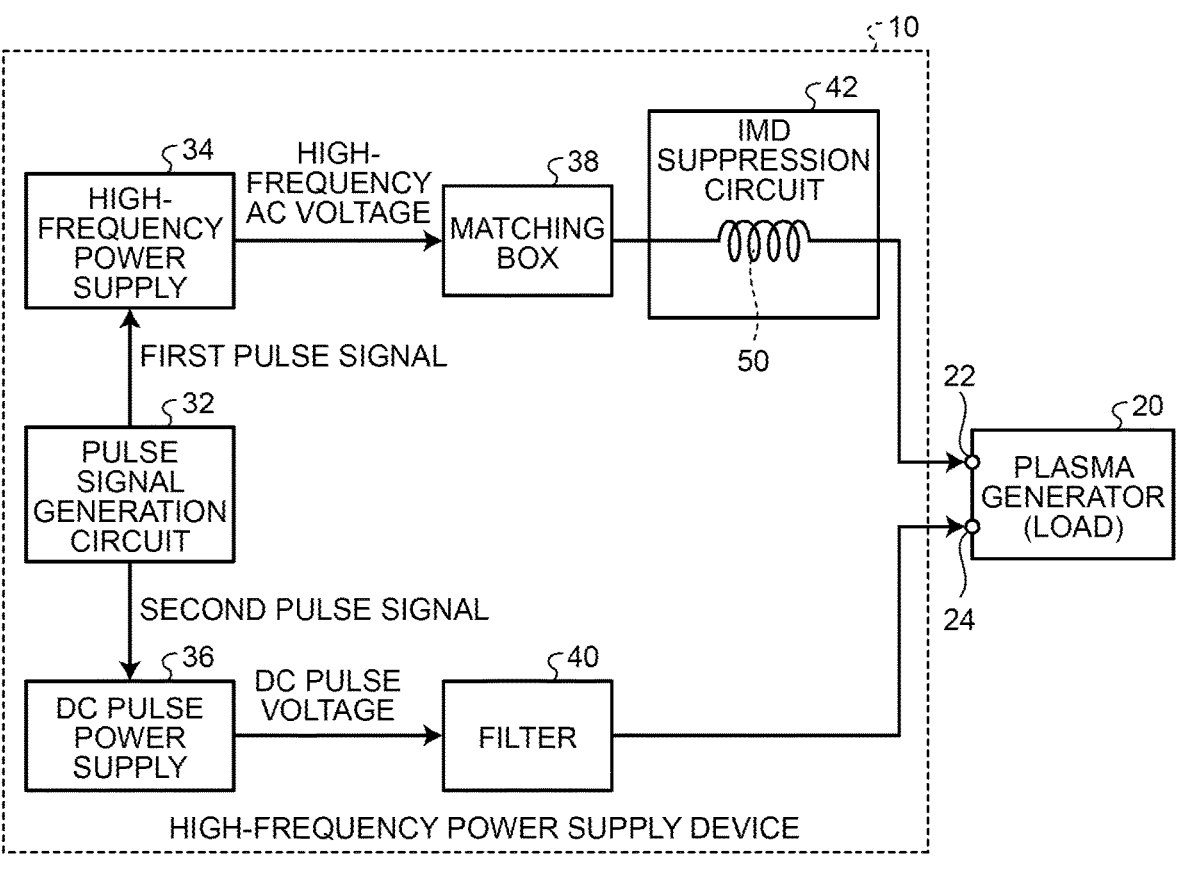
FIG. 1 is a diagram illustrating a configuration of a high-frequency power supply device together with a plasma generator.

FIG. 1 is a diagram illustrating a configuration of a high-frequency power supply device 10 according to an embodiment together with a plasma generator 20.

The high-frequency power supply device 10 supplies a high-frequency AC voltage, which is an AC voltage having a first frequency, to an AC-power input terminal 22 in the plasma generator 20 (a load) that generates plasma. The plasma generator 20 can convert gas in a vacuum chamber into plasma with electric power of the high-frequency AC voltage supplied by the high-frequency power supply device 10.

In addition, the high-frequency power supply device 10 outputs a DC pulse voltage having one or a plurality of continuous pulse waveforms to a pulse-power input terminal 24 different from the AC-power input terminal 22 in the plasma generator 20 simultaneously with the supply of the high-frequency AC voltage. The plasma generator 20 operates plasma generated in the vacuum chamber with electric power of the DC pulse voltage supplied by the high-frequency power supply device 10. For example, the plasma generator 20 performs anisotropic etching or the like on a sample such as a semiconductor wafer by operating the plasma. Note that, in the present embodiment, each of the one or the plurality of pulse waveforms included in the DC pulse voltage is a triangular wave. The pulse waveform included in the DC pulse voltage is not limited to the triangular wave and may be any waveform such as a square wave.

In addition, the high-frequency power supply device 10 may intermittently output the high-frequency AC voltage. That is, the high-frequency power supply device 10 may alternately repeat the output and stop of the high-frequency AC voltage. The high-frequency power supply device 10 may intermittently output the DC pulse voltage. That is, the high-frequency power supply device 10 may alternately repeat the output and stop of the DC pulse voltage. Note that the high-frequency AC voltage and the DC pulse voltage are further explained in detail with reference to FIG. 2.

As illustrated in FIG. 1, the high-frequency power supply device 10 includes a pulse signal generation circuit 32, a high-frequency power supply 34 (a first power supply), a DC pulse power supply 36 (a second power supply), a matching box 38, a filter 40, and an IMD suppression circuit 42.

The pulse signal generation circuit 32 outputs a first pulse signal indicating output and stop timings of the high-frequency AC voltage. The pulse signal generation circuit 32 supplies the first pulse signal to the high-frequency power supply 34. The pulse signal generation circuit 32 outputs a second pulse signal indicating output and stop timings of the DC pulse voltage. The pulse signal generation circuit 32 supplies the second pulse signal to the DC pulse power supply 36.

The high-frequency power supply 34 outputs a high-frequency AC voltage that is an AC voltage having the first frequency. In the present embodiment, the high-frequency power supply 34 alternately repeats the output and stop of the high-frequency AC voltage in synchronization with the timing of the first pulse signal. The high-frequency power supply 34 outputs the generated high-frequency AC voltage to the matching box 38.

The DC pulse power supply 36 outputs a DC pulse voltage including one or a plurality of continuous pulse waveforms. In the present embodiment, the DC pulse power supply 36 alternately repeats the output and stop of the DC pulse voltage in synchronization with the timing of the second pulse signal. The DC pulse power supply 36 outputs the generated DC pulse voltage to the filter 40.

The matching box 38 receives the high-frequency AC voltage from a high-frequency power supply 34. The matching box 38 performs impedance matching such that input impedance, that is, impedance on a load side viewed from the high-frequency power supply 34 becomes constant. The matching box 38 outputs the high-frequency AC voltage to the IMD suppression circuit 42.

A DC pulse voltage is input to the filter 40 from the DC pulse power supply 36. The filter 40 filters the DC pulse voltage and outputs the DC pulse voltage to the pulse-power input terminal 24 of the plasma generator 20, which is the load. The filter 40 includes, for example, a resistor, a capacitor, and an inductor. The filter 40 filters each of one or a plurality of pulse waveforms included in the DC pulse voltage output from the DC pulse power supply 36 to be formed in a predetermined shape. For example, the filter 40 filters a pulse waveform of a square wave included in the DC pulse voltage output from the DC pulse power supply 36 to be a triangular wave.

The IMD suppression circuit 42 includes a first inductor 50 having predetermined inductance. The first inductor 50 is provided between the matching box 38 and the AC-power input terminal 22 of the plasma generator 20, which is the load. The IMD suppression circuit 42 receives input of the high-frequency AC voltage output from the matching box 38, allows the input high-frequency AC voltage to pass through the first inductor 50, and outputs the high-frequency AC voltage to the AC-power input terminal 22 of the plasma generator 20.

Figure 2:
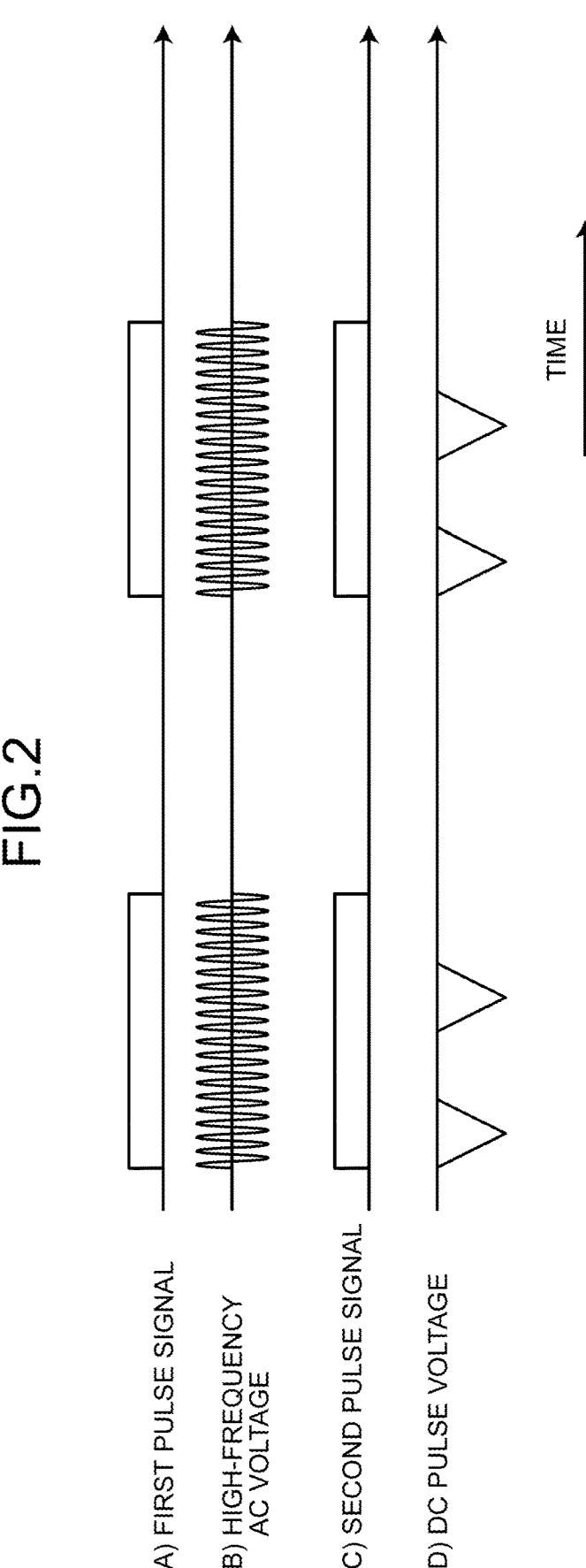

FIG. 2 is a diagram illustrating waveforms of a first pulse signal (A), a high-frequency AC voltage (B), a second pulse signal (C), and a DC pulse voltage (D).

As illustrated in (A) of FIG. 2, the first pulse signal is a binary signal representing a H logic or a L logic. In the first pulse signal, for example, a period of the H logic indicates a period in which the high-frequency AC voltage is output. In the first pulse signal, for example, a period of the L logic indicates a period in which the output of the high-frequency AC voltage is stopped.

As illustrated in (C) of FIG. 2, the second pulse signal is a binary signal representing the H logic or the L logic. In the second pulse signal, for example, a period of the H logic indicates a period in which the DC pulse voltage is output. In the second pulse signal, for example, a period of the L logic indicates a period in which the output of the DC pulse voltage is stopped.

Note that, in examples illustrated in FIG. 2, switching of the H logic and the L logic is synchronized in the first pulse signal and the second pulse signal. However, switching timing of the H logic and the L logic may not be synchronized in the first pulse signal and the second pulse signal.

The high-frequency AC voltage is a sinusoidal voltage as illustrated in (B) of FIG. 2. The high-frequency power supply 34 outputs the high-frequency AC voltage in the period in which the first pulse signal is the H logic and stops the output of the high-frequency AC voltage in the period in which the first pulse signal is the L logic. In this example, the frequency of the high-frequency AC voltage is 40.68

MHz. Note that the frequency of the high-frequency AC voltage is not limited to 40.68 MHz and may be another frequency.

As illustrated in (D) of FIG. 2, each of pulse waveforms of the DC pulse voltage is a triangular wave. The DC pulse voltage may include, between the pulse waveform and the pulse waveform, a period of a reference voltage (for example, 0 volt). Note that (D) of FIG. 2 illustrates the DC pulse voltage supplied from the filter 40 to the plasma generator 20. The DC pulse power supply 36 outputs the DC pulse voltage in the period in which the second pulse signal is the H logic and stops the output of the DC pulse voltage in the period in which the second pulse signal is the L logic.

The high-frequency AC voltage may have a waveform obtained by performing, on a sine wave signal having the first frequency, frequency modulation synchronized with each of one or a plurality of pulse waveforms included in the DC pulse voltage. For example, the high-frequency AC voltage may be 40.68 MHz of a reference frequency in a period in which the DC pulse voltage is a reference voltage (for example, 0 volt) and may be a frequency (40.68 MHz+modulation frequency) obtained by adding a modulation frequency proportional to an amplitude value of a pulse waveform to the reference frequency in a period in which the DC pulse voltage changes from the reference voltage (for example, 0 volt). Consequently, the high-frequency power supply device 10 can increase a reduction amount of IMD that occurs in the high-frequency AC voltage because of the influence of the DC pulse voltage.

The first pulse signal and the second pulse signal are generated by the pulse signal generation circuit 32. The pulse signal generation circuit 32 generates a first pulse signal and a second pulse signal based on a reference clock. For this reason, temporal positions of the pulse waveforms included in the DC pulse voltage with respect to the high-frequency AC voltage is specified on the basis of the reference clock. Therefore, by operating in synchronization with the reference clock, the high-frequency power supply 34 can accurately output a high-frequency AC voltage having a waveform obtained by performing, on the sine wave signal having the first frequency, frequency modulation synchronized with each of one or a plurality of pulse waveforms included in the DC pulse voltage.

Figure 3:
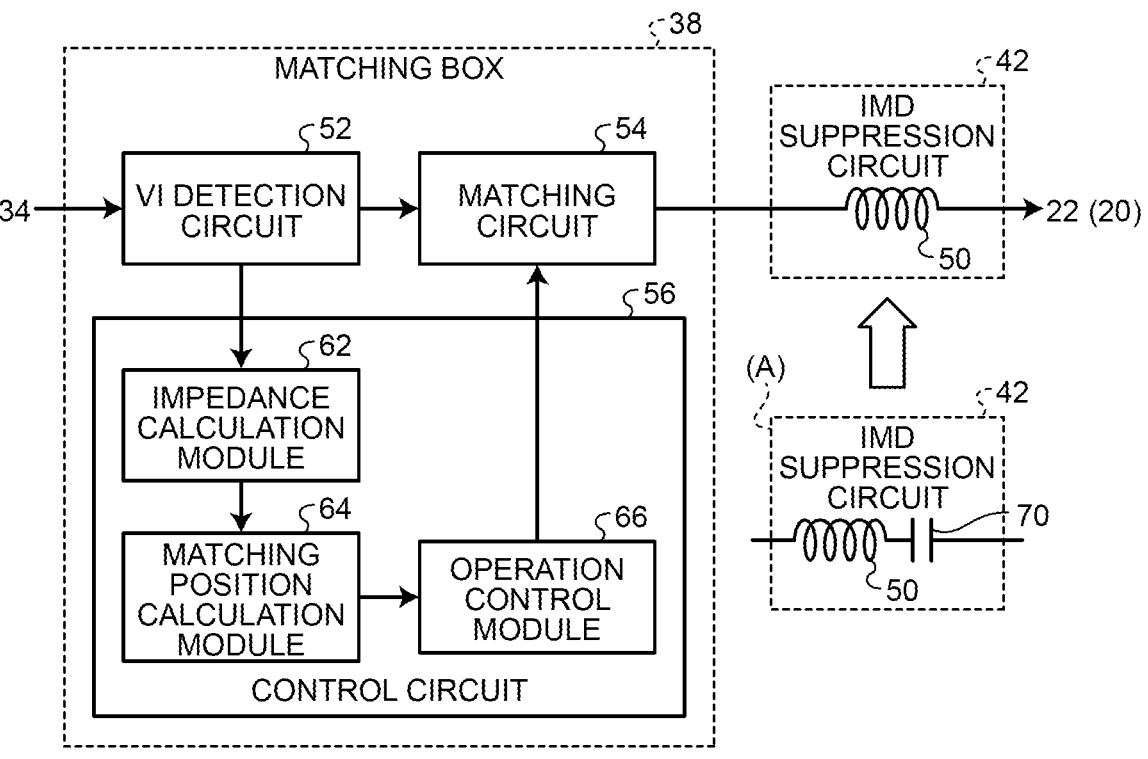
FIG. 3 is a diagram illustrating a configuration of a matching box and an IMD suppression circuit.

FIG. 3 is a diagram illustrating configurations of the matching box 38 and the IMD suppression circuit 42. The matching box 38 includes a VI detection circuit 52, a matching circuit 54, and a control circuit 56.

The VI detection circuit 52 measures a voltage (V) and an electric current (I) at an input end of the matching box 38 in every predetermined time.

A high-frequency AC voltage is supplied to the matching circuit 54 from the high-frequency power supply 34 via the VI detection circuit 52. The matching circuit 54 is a network circuit including a plurality of inductors and a plurality of capacitors. The matching circuit 54 is capable of changing impedance. In the matching circuit 54, impedance between an input end and an output end is changed according to a control signal given from the control circuit 56.

The control circuit 56 is implemented by, for example, a processor such as a CPU (Central Processing Unit) or a reconfigurable semiconductor device such as an FPGA (Field-Programmable Gate Array). The control circuit 56 includes an impedance calculation module 62, a matching position calculation module 64, and an operation control module 66 as functional components.

The impedance calculation module 62 acquires the voltage (V) and the electric current (I) detected by the VI detection circuit 52 in every predetermined time. The impedance calculation module 62 calculates, in every predetermined time, based on the acquired voltage (V) and the acquired current (I), impedance at an input end to which a high-frequency AC voltage is supplied.

The matching position calculation module 64 calculates, in every predetermined time, impedance of the matching circuit 54 with which the impedance at the input end of the matching box 38 has a preset value. The operation control module 66 gives a control signal to the matching circuit 54 in every predetermined time and changes the impedance of the matching circuit 54 to be the impedance calculated by the matching position calculation module 64.

The matching box 38 having such a configuration can change the impedance of the matching circuit 54 in every predetermined period and perform impedance matching such that the impedance of the matching box 38 viewed from the high-frequency power supply 34 becomes constant at a preset value. Consequently, the matching box 38 can make the impedance on the load side viewed from the high-frequency power supply 34 constant irrespective of the fluctuation in the impedance of the plasma generator 20, which is the load.

Note that the matching box 38 may include a directional coupler instead of the VI detection circuit 52. The directional coupler detects a traveling wave voltage and a reflected wave voltage at an input end to which a high-frequency AC voltage is supplied. In this case, the impedance calculation module 62 calculates, in every predetermined time, based on the traveling wave voltage and the reflected wave voltage, a reflection coefficient at the input end to which the high-frequency AC voltage is supplied. Note that, since the impedance on the load side viewed from the high-frequency power supply 34 and the reflection coefficient at the input end to which the high-frequency AC voltage is supplied can be mutually converted, whichever of the impedance and the reflection coefficient may be detected.

One terminal of the first inductor 50 included in the IMD suppression circuit 42 is connected to an output end of the matching box 38 and the other terminal is connected to the AC-power input terminal 22 of the plasma generator 20. Consequently, the IMD suppression circuit 42 can allow the high-frequency AC voltage output from the matching box 38 to pass through the first inductor 50 and output the high-frequency AC voltage to the AC-power input terminal 22 of the plasma generator 20.

With such a configuration, it is possible to enhance an effect of suppressing IMD that occurs on the high-frequency power supply 34 side. That is, in the plasma generator 20, capacitance fluctuates because of the influence of pulse waveforms included in the DC pulse voltage. The matching box 38 makes a transient response according to the fluctuation in the capacitance. At this time, since a time of the transient response due to the influence of the DC pulse voltage output from the DC pulse power supply 36 is shorter than a frequency of a pulse waveform of the DC pulse voltage, an impedance change at the time of the transient response increases. However, by inserting the first inductor 50, a sudden impedance change at the time of transient response is suppressed. As a result, the effect of suppressing IMD is enhanced. Note that a proper value of the inductance of the first inductor 50 is smaller as a frequency of a pulse waveform (for example, a triangular wave) included in the DC pulse voltage is higher.

The plasma generator 20 changes a plasma generation position in an opposing direction of two positive and negative electrodes in the vacuum chamber according to the pulse waveform included in the DC pulse voltage. As a result, the capacitance of a virtual capacitor formed between the positive and negative two electrodes changes in synchronization with the pulse waveform. Since the change in the capacitance is fast, the high-frequency power supply device 10 cannot cause the impedance for the first frequency to follow the change in the capacitance even if an impedance automatic matching function by the matching box 38 is used. Therefore, when the high-frequency power supply device 10 does not include the IMD suppression circuit 42, IMD corresponding to the pulse waveform included in the DC pulse voltage is caused in the high-frequency AC voltage having the first frequency.

Here, as a result of a simulation, it has been found that such IMD is caused by a transient response of the matching box 38 caused by electrostatic fluctuation of the plasma generator 20 due to the influence of the DC pulse voltage. It has been found that such a transient response of the matching box 38 can be suppressed by inserting inductance between the matching box 38 and the plasma generator 20. Therefore, even if the change in capacitance is faster than the impedance automatic matching function by the matching box 38, the high-frequency power supply device 10 can suppress the IMD due to the influence of the DC pulse voltage by including the IMD suppression circuit 42. Consequently, the high-frequency power supply device 10 according to the present embodiment can efficiently suppress the IMD that occurs in the high-frequency AC voltage because of the influence of the DC pulse voltage and efficiently supply the high-frequency AC voltage to the plasma generator 20.

The IMD suppression circuit 42 is provided at a post stage of the matching box 38, that is, between the matching box 38 and the plasma generator 20. Therefore, in the high-frequency power supply device 10 according to the present embodiment, since a filter and the like are not provided between the matching box 38 and the high-frequency power supply 34, the matching box 38 can perform impedance matching to reduce a reflected wave reflected by the high-frequency power supply 34. Consequently, the high-frequency power supply device 10 according to the present embodiment can perform accurate matching operation.

Note that, as illustrated in (A) of FIG. 3, the IMD suppression circuit 42 may include a first capacitor 70 connected in series to the first inductor 50 in addition to the first inductor 50. More specifically, in a circuit configured by the first inductor 50 and the first capacitor 70 connected in series, one terminal is connected to the output terminal of the matching box 38 and the other terminal is connected to the AC-power input terminal 22 of the plasma generator 20.

The first capacitor 70 has such capacitance that reactance for the first frequency, which is the frequency of the high-frequency AC voltage, cancels reactance for the first frequency of the first inductor 50. Consequently, in the IMD suppression circuit 42, the reactance of synthesis for the first frequency becomes substantially 0. Since the reactance of the IMD suppression circuit 42 becomes 0, a matching range of the impedance of the matching box 38 becomes the same as a matching range in the case in which the IMD suppression circuit 42 is not provided. Therefore, even if the IMD suppression circuit 42 is provided, the matching box 38 can perform an impedance matching operation without changing an initial setting value and a matching range at the time of the matching operation.

Simulations

A result of a first simulation is explained.

Figure 4:
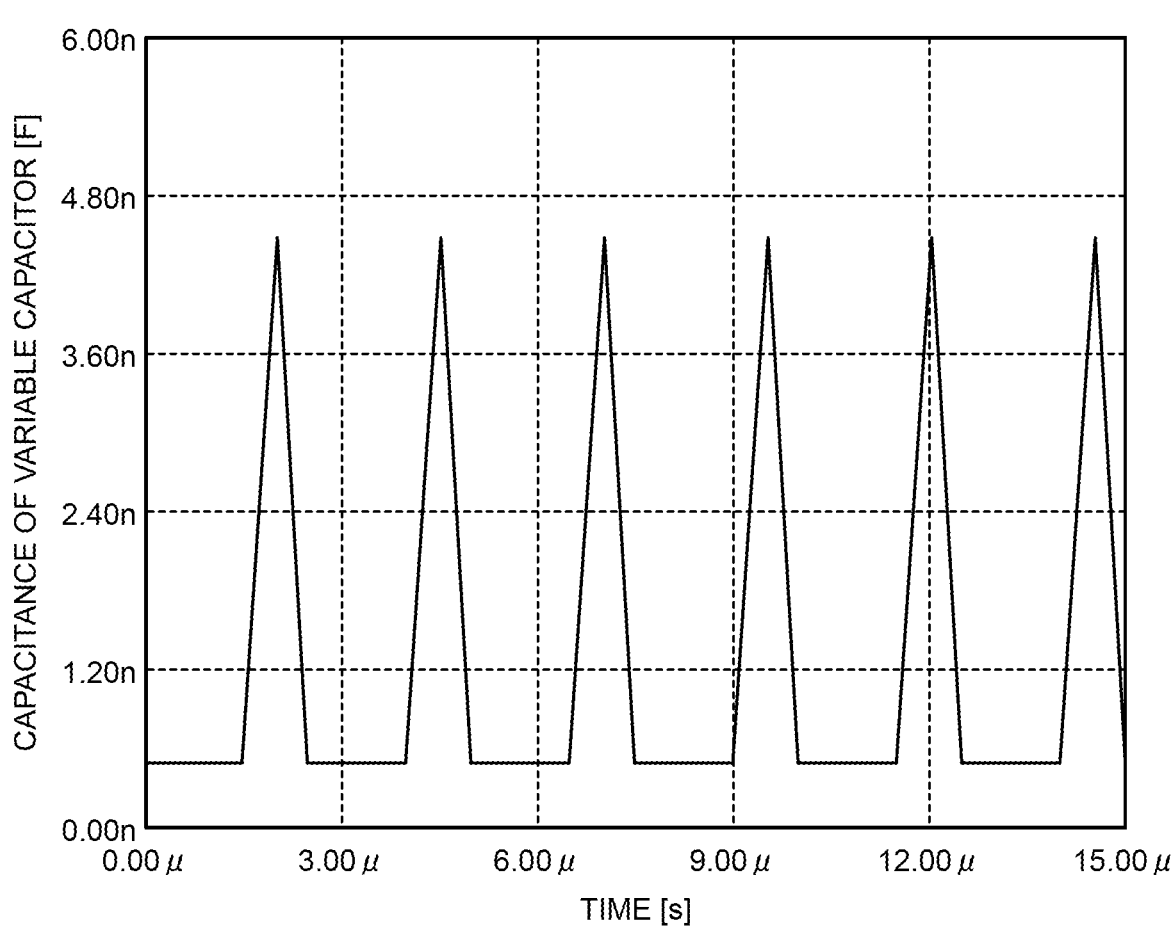
FIG. 4 is a diagram illustrating a simulation waveform of a capacitance change of a load.

The present inventor performed a simulation of the high-frequency power supply device 10 with a circuit simulator. In the first simulation, a sinusoidal high-frequency AC voltage of 40.68 MHz was generated from the high-frequency power supply device 10 and, when a capacitor component included in a load was regarded as a variable capacitor, the capacitance of the variable capacitor was changed as illustrated in FIG. 4. In the first simulation, a locus of the impedance at the input end of the matching box 38 in the case in which the simulation explained above was performed was calculated.

FIG. 4 is a diagram illustrating a time change waveform of the variable capacitance in the first simulation. In the plasma generator 20, a DC pulse voltage including a pulse waveform synchronized with the waveform illustrated in FIG. 4 is applied to the pulse-power input terminal 24, whereby capacitance changes as illustrated in FIG. 4. Therefore, in the first simulation, a load viewed from the AC-power input terminal 22 of the plasma generator 20 was regarded as a series circuit of a resistor and a variable capacitor. In the first simulation, a resistance value of resistance was set to 4Ω. In the first simulation, the capacitance of the variable capacitor was changed to be a triangular wave in a range of 0.5 nF to 4.5 nF as illustrated in FIG. 4.

Figure 5A:
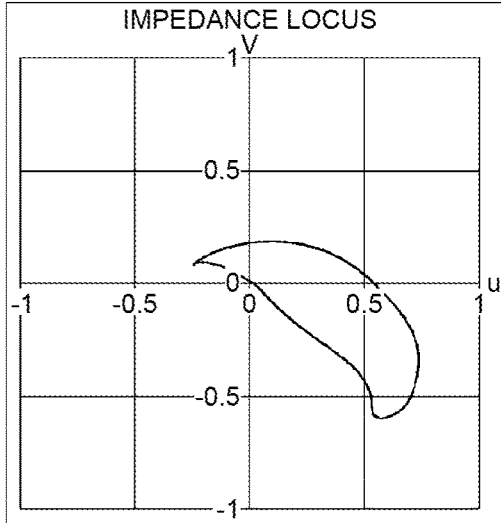
FIGS. 5A to 5C are diagrams illustrating impedance loci in the case in which a simulation is performed without frequency-modulating the high-frequency AC voltage.
Figure 5B:
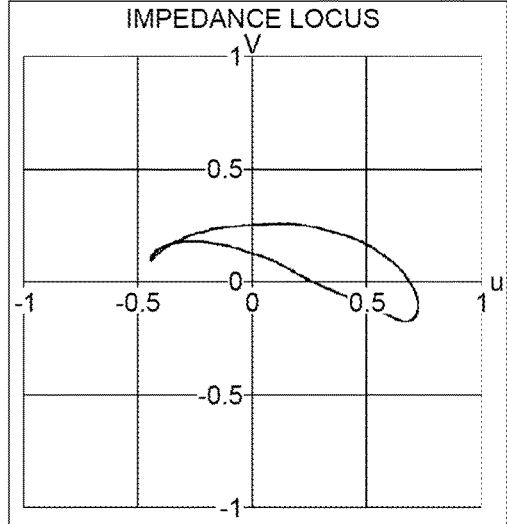
Figure 5C:
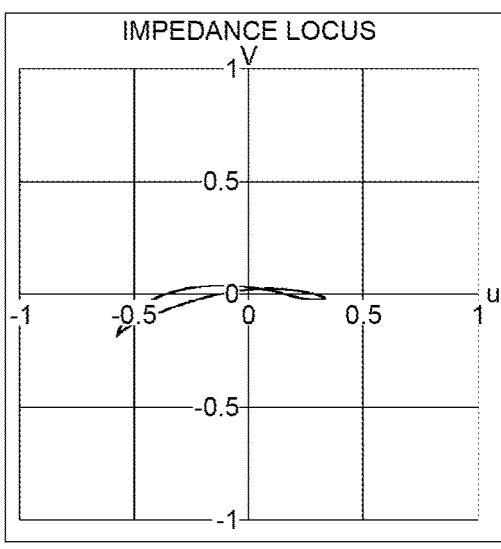

FIGS. 5A, 5B, and 5C illustrate loci of impedance standardized by characteristic impedance at the input end of the matching box 38 calculated by the first simulation. FIGS. 5A, 5B, and 5C are polar charts, in which a vertical axis indicates an imaginary component (v) of impedance and a horizontal axis indicates an impedance real component (u).

Further, FIG. 5A illustrates a locus of impedance in the case in which the inductance of the first inductor 50 of the IMD suppression circuit 42 is 0 and the capacitance of the first capacitor 70 is infinite, that is, in the case in which the IMD suppression circuit 42 is not provided. FIG. 5B illustrates a locus of impedance in the case in which the inductance of the first inductor 50 is 306 nH and the capacitance of the first capacitor 70 is 50 pF. FIG. 5C illustrates a locus of impedance in the case in which the inductance of the first inductor 50 is 1.05 μH and the capacitance of the first capacitor 70 is 15 pF.

A change in impedance is smaller in the cases of FIGS. 5B and 5C compared with FIG. 5A. In particular, in the case of FIG. 5C, a change in impedance is very small.

Table 1 shows the reflection coefficient at the input end of the matching box 38 in the first simulation. As shown in Table 1, since the high-frequency power supply device 10 according to the embodiment includes the IMD suppression circuit 42, the reflection coefficient can be reduced.

TABLE 1

| Parameter of IMD suppression circuit | Reflection coefficient |
| --- | --- |
| None | 0.326 |
| 306 nH 50 pF | 0.391 |
| 1.05 μH 15 pF | 0.236 |

As explained above, since the high-frequency power supply device 10 according to the embodiment includes the IMD suppression circuit 42, even if the capacitance of the plasma generator 20 fluctuates according to the pulse waveform included in the DC pulse voltage, the change in the impedance at the input end of the matching box 38 can be reduced. Consequently, the high-frequency power supply device 10 according to the embodiment can suppress IMD and efficiently supply the high-frequency AC voltage to the plasma generator 20. In particular, the IMD suppression circuit 42 can further reduce the change in impedance at the input end of the matching box 38 when the inductance of the first inductor 50 is 300 nH or more.

Next, a result of a second simulation is explained.

In the second simulation, a high-frequency AC voltage obtained by frequency-modulating a sine wave of 40.68 MHz was generated from the high-frequency power supply device 10 and a simulation for changing a load as illustrated in FIG. 4 in the same manner as in the first simulation was performed. Then, in the second simulation, a locus of the impedance at the input end of the matching box 38 in the case in which the simulation explained above was calculated.

Figure 6:
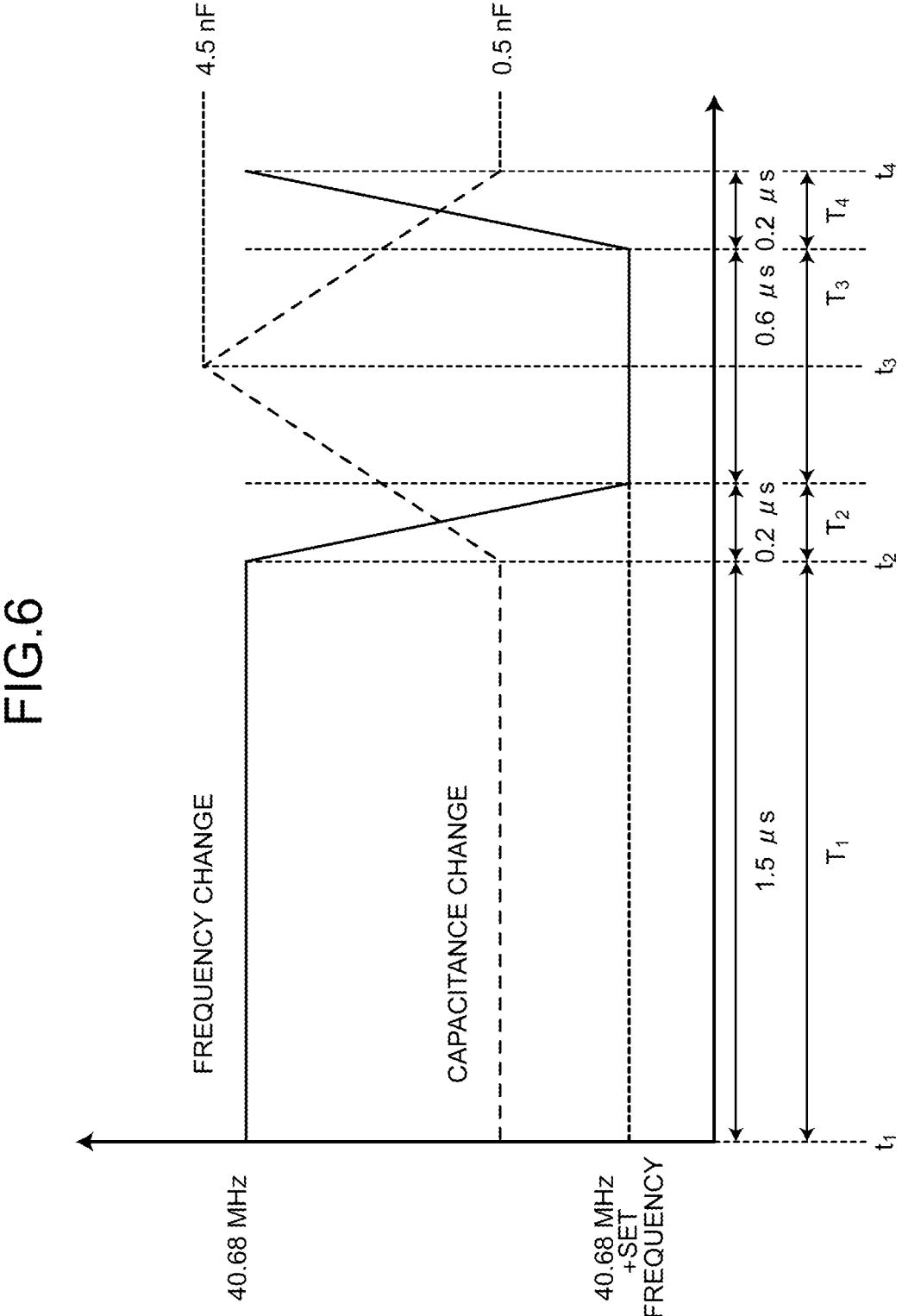
FIG. 6 is a diagram illustrating a frequency change of the high-frequency AC voltage in the case in which a simulation is performed by frequency-modulating the high-frequency AC voltage.

FIG. 6 is a diagram illustrating a frequency change of a high-frequency AC voltage with respect to a time change waveform of a variable capacitance of the plasma generator 20 in the second simulation.

The variable capacitance is constant at 0.5 nF from first time ($t_1$) to second time ($t_2$). Subsequently, the variable capacitance linearly rises from the second time ($t_2$) to third time ($t_3$) and reaches 4.5 nF at the third time ($t_3$). Subsequently, the variable capacitance linearly decreases from the third time ($t_3$) to fourth time ($t_4$) and reaches 0.5 nF at the fourth time ($t_4$). The variable capacitance repeatedly changes with the first time ($t_1$) to the fourth time ($t_4$) as one cycle.

Note that the second time ($t_2$) is time when 1.5 μs elapsed from the first time ($t_1$). The third time ($t_3$) is time when 0.5 μs elapsed from the second time ($t_2$). The fourth time ($t_4$) is time when 0.5 μs elapsed from the third time ($t_3$).

In the second simulation, the high-frequency power supply device 10 makes the frequency of the high-frequency AC voltage constant at 40.68 MHz in a first period ($T_1$). The first period ($T_1$) is a period in which the variable capacitance is constant at 0.5 nF and is a period starting at the first time ($t_1$) and ending at the second time ($t_2$).

In the second simulation, in a second period ($T_2$), the high-frequency power supply device 10 linearly reduces the frequency of the high-frequency AC voltage from 40.68 MHz to a frequency obtained by adding a preset set frequency to 40.68 MHz. The second period ($T_2$) is a period that starts at the second time ($t_2$) and ends at time when 0.2 μs elapsed from the second time ($t_2$). Note that the preset set frequency is a negative value.

In the second simulation, in a third period ($T_3$), the high-frequency power supply device 10 makes the frequency of the high-frequency AC voltage constant at a frequency obtained by adding the set frequency to 40.68 MHz. The third period ($T_3$) is a period that starts at time when 0.2 μs elapsed from second time ($t_2$) and ends at time when 0.6 μs elapsed from the second time ($t_2$).

In the second simulation, in a fourth period ($T_4$), the high-frequency power supply device 10 linearly increases the frequency of the high-frequency AC voltage from the frequency obtained by adding the set frequency to 40.68 MHz to 40.68 MHz. The fourth period ($T_4$) is a period that starts at time when 0.8 μs elapsed from the second time ($t_2$) and ends at the fourth time ($t_4$).

In the second simulation, the high-frequency power supply device 10 repeatedly changes the frequency of the high-frequency AC voltage with the first period ($T_1$), the second period ($T_2$), the third period ($T_3$), and the fourth period (Ta) as one cycle.

Figure 7A:
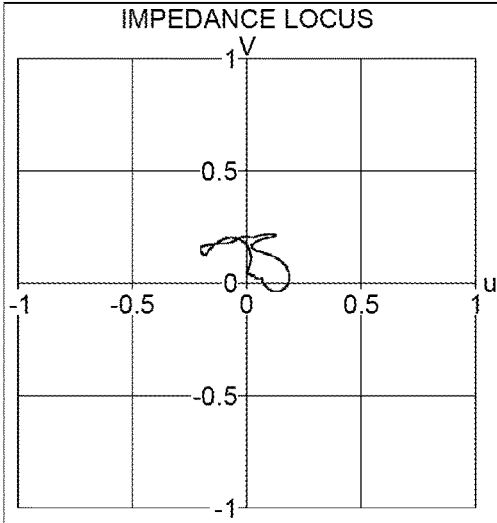
FIGS. 7A to 7C are diagrams illustrating impedance loci in the case in which a simulation is performed by frequency-modulating the high-frequency AC voltage.
Figure 7B:
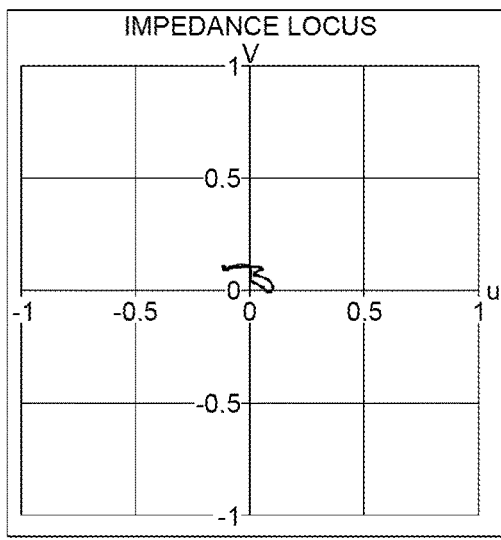
Figure 7C:
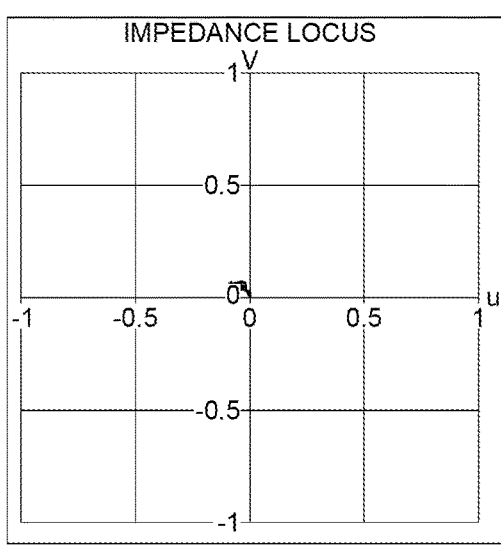

FIGS. 7A, 7B, and 7C illustrate loci of impedances standardized by the characteristic impedance at the input end of the matching box 38 calculated by the second simulation. FIGS. 7A, 7B, and 7C are polar charts, in which a vertical axis indicates an imaginary component (v) of impedance and a horizontal axis indicates an impedance real component (u).

Further, FIG. 7A illustrates a locus of impedance in the case in which the inductance of the first inductor 50 of the IMD suppression circuit 42 is 0, the capacitance of the first capacitor 70 is infinite, and the set frequency is –2.1 MHz, that is, in the case in which the IMD suppression circuit 42 is not provided and the set frequency is –2.1 MHz. FIG. 7B illustrates a locus of impedance in the case in which the inductance of the first inductor 50 is 306 nH, the capacitance of the first capacitor 70 is 50 pF, and the set frequency is –0.8 MHz. FIG. 7C illustrates a locus of impedance in the case in which the inductance of the first inductor 50 is 1.05 μH, the capacitance of the first capacitor 70 is 15 pF, and the set frequency is –0.4 MHz.

A change in the impedance is smaller in the cases of FIGS. 7B and 7C compared with FIG. 7A. In particular, in the case of FIG. 7C, the change in the impedance is very small. A frequency modulation degree of the set frequency, that is, the high-frequency AC voltage is also smaller in the cases of FIGS. 7B and 7C compared with FIG. 7A.

Table 2 shows a reflection coefficient at the input end of the matching box 38 in the second simulation. As shown in Table 2, since the high-frequency power supply device 10 according to the embodiment includes the IMD suppression circuit 42, the reflection coefficient can be reduced.

TABLE 2

| Parameter of IMD suppression circuit | Reflection coefficient |
|---|---|
| None | 0.088 |
| 306 nH 50 pF | 0.060 |
| 1.05 μH 15 pF | 0.031 |

As explained above, since the high-frequency power supply device 10 according to the embodiment includes the IMD suppression circuit 42, when the capacitance of the plasma generator 20 fluctuates according to the DC pulse voltage, the change in impedance at the input end of the matching box 38 can be reduced and the frequency modulation degree of the high-frequency AC voltage can also be reduced. Consequently, since the high-frequency power supply device 10 according to the embodiment does not have to include a wide band and large high-frequency power supply device 10, IMD of the high-frequency AC voltage can be efficiently suppressed and the high-frequency AC voltage can be supplied to the plasma generator 20.

According to the present disclosure, it is possible to efficiently suppress intermodulation distortion that occurs in a high-frequency AC voltage because of the influence of a DC pulse voltage.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A high-frequency power supply device comprising:

a first power supply configured to output a high-frequency AC voltage that is an AC voltage having a first frequency;

a second power supply configured to output a DC pulse voltage including one or a plurality of continuous pulse waveforms;

a matching box configured to receive input of the high-frequency AC voltage from the first power supply, perform impedance matching such that impedance viewed from the first power supply becomes constant, and output the high-frequency AC voltage;

a filter configured to receive input of the DC pulse voltage from the second power supply, filter the DC pulse voltage, and output the filtered DC pulse voltage to a pulse-power input terminal of a load; and an IMD (intermodulation distortion) suppression circuit including a first inductor having predetermined inductance provided between the matching box and an AC-power input terminal of the load, the IMD suppression circuit being configured to receive input of the high-frequency AC voltage output from the matching box, allow the input high-frequency AC voltage to pass through the first inductor, and output the high-frequency AC voltage to the AC-power input terminal of the load, wherein the IMD suppression circuit further includes a first capacitor having predetermined capacitance, and wherein the first capacitor has capacitance with which reactance for the first frequency cancels reactance for the first frequency of the first inductor.

2. The high-frequency power supply device according to claim 1, wherein the high-frequency AC voltage includes a waveform obtained by performing, on a sine wave signal having the first frequency, frequency modulation synchronized with each of the one or the plurality of pulse waveforms included in the DC pulse voltage.

3. The high-frequency power supply device according to claim 1, wherein the load includes a plasma generator that generates plasma.

4. A high-frequency power supply device comprising:

a first power supply configured to output a high-frequency AC voltage that is an AC voltage having a first frequency;

a second power supply configured to output a DC pulse voltage including one or a plurality of continuous pulse waveforms;

a matching box configured to receive input of the high-frequency AC voltage from the first power supply, perform impedance matching such that impedance viewed from the first power supply becomes constant, and output the high-frequency AC voltage;

a filter configured to receive input of the DC pulse voltage from the second power supply, filter the DC pulse voltage, and output the filtered DC pulse voltage to a pulse-power input terminal of a load; and an IMD (intermodulation distortion) suppression circuit including a first inductor having predetermined inductance provided between the matching box and an AC-power input terminal of the load, the IMD suppression circuit being configured to receive input of the high-frequency AC voltage output from the matching box, allow the input high-frequency AC voltage to pass through the first inductor, and output the high-frequency AC voltage to the AC-power input terminal of the load, wherein the high-frequency AC voltage includes a waveform obtained by performing, on a sine wave signal having the first frequency, frequency modulation synchronized with each of the one or the plurality of pulse waveforms included in the DC pulse voltage.

5. The high-frequency power supply device according to claim 4, wherein the load includes a plasma generator that generates plasma.

* * * * *